United States Patent
Yamashita et al.

(10) Patent No.: US 11,259,408 B2
(45) Date of Patent: Feb. 22, 2022

(54) STRETCHABLE WIRING SHEET AND STRETCHABLE TOUCH SENSOR SHEET

(71) Applicant: Tokusen Kogyo Co., Ltd., Ono (JP)

(72) Inventors: Masato Yamashita, Hyogo (JP); Shin Sumimoto, Hyogo (JP); Manabu Yoshida, Ibaraki (JP); Sei Uemura, Ibaraki (JP); Taiki Nobeshima, Ibaraki (JP)

(73) Assignee: TOKUSEN KOGYO CO., LTD., Ono (JP)

( * ) Notice: Subject to any disclaimer, the term of this patent is extended or adjusted under 35 U.S.C. 154(b) by 717 days.

(21) Appl. No.: 16/070,580

(22) PCT Filed: Jan. 5, 2017

(86) PCT No.: PCT/JP2017/000133
§ 371 (c)(1),
(2) Date: Jul. 17, 2018

(87) PCT Pub. No.: WO2017/126325
PCT Pub. Date: Jul. 27, 2017

(65) Prior Publication Data
US 2020/0396832 A1      Dec. 17, 2020

(30) Foreign Application Priority Data

Jan. 19, 2016    (JP) .............................. JP2016-007844

(51) Int. Cl.
*H05K 1/02* (2006.01)
*B32B 7/022* (2019.01)
(Continued)

(52) U.S. Cl.
CPC ............. *H05K 1/0283* (2013.01); *B32B 5/24* (2013.01); *B32B 7/022* (2019.01); *B32B 25/10* (2013.01);
(Continued)

(58) Field of Classification Search
CPC ........ H05K 1/0283; B32B 5/24; B32B 7/022; B32B 25/10; G06F 3/0446; G06F 3/04164
See application file for complete search history.

(56) References Cited

U.S. PATENT DOCUMENTS

2002/0008815 A1* 1/2002 Hanakawa ........ G02F 1/133553
349/113
2004/0012570 A1* 1/2004 Cross ...................... G06F 3/045
345/173

(Continued)

FOREIGN PATENT DOCUMENTS

EP      3043143 A1     7/2016
JP      8-201785 A     8/1996
(Continued)

OTHER PUBLICATIONS

Extended Search Report issued by the European Patent Office in corresponding European Patent Application No. 17741205.3-1231 dated Jul. 24, 2019 (9 pages).
(Continued)

*Primary Examiner* — Shaheda A Abdin
(74) *Attorney, Agent, or Firm* — Buchanan Ingersoll & Rooney PC

(57) ABSTRACT

A stretchable contractible wiring sheet includes: stretchable contractible first elastomer sheet; stretchable contractible second elastomer sheet facing and bonded on the first elastomer sheet, and lead that has a transverse section having any cross-sectional shape selected from circular shape, elliptical shape, and track shape, and is plastically deformed in wavy shape periodically curving along longer direction, the lead being interposed between the first elastomer sheet and the second elastomer sheet in a manner that height direction of waves in wavy shape is along in-plane direction of facing surfaces of the first elastomer sheet and second elastomer (Continued)

sheet. The wiring sheet that can be produced easily at low costs, has high flexibility and durability, and undergoes small resistance value change along with stretching and contracting, and stretchable contractible touch sensor sheet.

9 Claims, 5 Drawing Sheets

(51) Int. Cl.
*G06F 3/044* (2006.01)
*G06F 3/041* (2006.01)
*B32B 5/24* (2006.01)
*B32B 25/10* (2006.01)

(52) U.S. Cl.
CPC ........ *G06F 3/0446* (2019.05); *G06F 3/04164* (2019.05); *B32B 2457/208* (2013.01); *G06F 2203/04102* (2013.01); *H05K 2201/0133* (2013.01); *H05K 2201/10151* (2013.01)

(56) References Cited

U.S. PATENT DOCUMENTS

| | | | |
|---|---|---|---|
| 2004/0192082 A1* | 9/2004 | Wagner | H05K 1/11 439/67 |
| 2006/0061974 A1 | 3/2006 | Soga et al. | |
| 2008/0257586 A1 | 10/2008 | Chen et al. | |
| 2009/0173529 A1 | 7/2009 | Lee et al. | |
| 2010/0247810 A1* | 9/2010 | Yukinobu | H01B 1/20 428/1.4 |
| 2013/0098665 A1 | 4/2013 | Ishii et al. | |
| 2014/0138637 A1 | 5/2014 | Yang et al. | |
| 2014/0205853 A1* | 7/2014 | Funakubo | C09D 5/24 428/605 |
| 2014/0272201 A1* | 9/2014 | Takeda | C09J 133/066 428/1.54 |
| 2016/0124550 A1 | 5/2016 | Tada et al. | |
| 2016/0209441 A1* | 7/2016 | Mazzeo | G06F 3/0444 |
| 2016/0231098 A1 | 8/2016 | Otaka et al. | |
| 2016/0349971 A1* | 12/2016 | Chi | G09G 5/373 |

FOREIGN PATENT DOCUMENTS

| | | |
|---|---|---|
| JP | 2005-191113 A | 7/2005 |
| JP | 2011-34822 A | 2/2011 |
| JP | 2013-84842 A | 5/2013 |
| JP | 2013-89910 A | 5/2013 |
| JP | 2013-187308 A | 9/2013 |
| JP | 2013-187380 A | 9/2013 |
| JP | 2013-206080 A | 10/2013 |
| JP | 2015-18494 A | 1/2015 |
| JP | 2015-197382 A | 11/2015 |
| TW | 592871 B | 6/2004 |
| TW | 201005609 A | 2/2010 |
| TW | 201427516 A | 7/2014 |
| WO | WO 2009/102077 A1 | 8/2009 |
| WO | 2015/029955 A1 | 3/2015 |

OTHER PUBLICATIONS

International Search Report (PCT/ISA/210) dated Mar. 14, 2017, by the Japanese Patent Office as the International Searching Authority for International Application No. PCT/JP2017/000133.
Written Opinion (PCT/ISA/237) dated Mar. 14, 2017, by the Japanese Patent Office as the International Searching Authority for International Application No. PCT/JP2017/000133.
Taiwanese First Office Action with no English translation dated Aug. 29, 2017 issued in a corresponding Taiwanese Application No. 106101635.
Office Action (Notice of Reasons for Refusal) dated Nov. 10, 2020, by the Japanese Patent Office in corresponding Japanese Patent Application No. 2017-562498, and an English translation of the Office Action. (8 pages).
Communication pursuant to Article 94(3) EPC dated Jun. 16, 2020, by the European Patent Office in the corresponding European Patent Application No. 17741205.3. (8 pages).
Gray et al., "High-Conductivity Elastomeric Electronics," Advanced Materials, May 5, 2004, vol. 16, No. 5, pp. 393-397.
Anonymous: "Cold working—Wikipedia", Nov. 16, 2008 (Nov. 16, 2008), pp. 1-4, XP055849557, Retrieved from the Internet: URL:https://en.wikipedia.org/w/index.php?title=Cold_working&oldid=252247384 [retrieved on Oct. 8, 2021].
Anonymous: "Wire drawing—Wikipedia", Nov. 29, 2014 (Nov. 29, 2014), pp. 1-4, XP055849558, Retrieved from the Internet:URL:https://en.wikipedia.org/w/index.php?title=Wire_drawing&oldid=635922608 [retrieved on Oct. 8, 2021].
Singh Charanjeet: "Mechanical Engineering: Hot working and Cold working (Forging, Extrusion, Rolling)", Jul. 8, 2013 (Jul. 8, 2013), pp. 1-14, XP055849098, Retrieved from the Internet: URL:http://mech413.blogspot.com/2013/07/hot-working-and-cold-working-forging.html [retrieved on Oct. 7, 2021].
Matteo Stoppa et al.: "Wearable Electronics and Smart Textiles: A Critical Review", SENSORS, Jul. 7, 2014, vol. 14, No. 7, pp. 11957-11992, XP055327328.
Summons to attend oral proceedings issued on Oct. 18, 2021, by the European Patent Office in corresponding European Patent Application No. 177441205.3. (10 pages).

* cited by examiner

STRETCHABLE WIRING SHEET AND STRETCHABLE TOUCH SENSOR SHEET

TECHNICAL FIELD

The present invention relates to a stretchable contractible wiring sheet having an excellent stretchability/contractibility and including a lead between two stretchable contractible elastomer sheets, and a stretchable contractible touch sensor sheet.

BACKGROUND ART

In recent years, demands for stretchable contractible wiring sheets have been increasing in various fields including, for example, antennas and wirings for RFID devices required to have flexibility, wirings for motion analysis sensors in the sport science, wearable heart rate/electrocardiogram monitors, wiring sheets for movable parts of robots, touch sensor sheets configured to send instructions to computers, and wiring sheets for bendable sensors to be worn on fingers, elbow joints, and knee joints for remotely controlling robots. These stretchable contractible wiring sheets are required to have an excellent stretchability/contractibility and to undergo a small resistance value change along with stretching and contracting.

In this context, there has been a proposal for producing a stretchable contractible conductive rubber by dispersing, for example, an ionic liquid and carbon nanotube in a rubber (see PTL 1).

However, in this proposal, materials such as carbon nanotube for forming the stretchable contractible conductor are expensive and need to be contained at extremely high content ratios in order to obtain a sufficient conductivity. Hence, there is a problem of running up the production cost even more.

There have also been proposals for producing stretchable contractible circuit boards by pasting copper wirings having wavy structures on elastomers (see PTLs 2 and 3).

However, in these proposals, the copper wirings are formed by etching copper foils that are laminated on the elastomers, and the cross-sections of the copper wirings are formed in rectangular shapes. Therefore, there is a problem that when the produced sheets are pasted on, for example, curved surfaces and undergo stretching and contracting, stress tends to concentrate on the edges of the rectangular cross-sections, to break the wirings.

There has also been a proposal for disposing wirings formed of a urethane rubber and silver powder on the lower surface of an elastomer sheet formed of an ester-based urethane rubber (see PTL 4).

However, in this proposal, there is a problem that the production cost is high, because leads having stretchability/contractibility are formed individually by encapsulating the urethane rubber with the silver powder. Further, there is a problem that flexibility and durability are poor, because if the formed leads undergo shape changes along with elongation and bending operations to make electric contact between silver powder particles discontinuous at any portion, the leads cannot serve the function.

There has also been proposed a conductive fiber sheet obtained by disposing an antenna for a booster formed of conductive fibers in a manner to face an antenna of an IC chip in a non-bonded state (see PTL 5).

However, in this proposal, there is a problem that the conductive fibers are expensive, and even more cost increase is incurred by the conductive fiber sheet that is wasted in cutting works performed to conform to various antenna shapes.

CITATION LIST

Patent Literature

PTL 1: International Publication No. WO 2009/102077
PTL 2: Japanese Patent Application Laid-Open (JP-A) No. 2013-187308
PTL 3: JP-A No. 2013-187380
PTL 4: JP-A No. 2011-34822
PTL 5: JP-A No. 2013-206080

SUMMARY OF INVENTION

Technical Problem

The present invention aims for solving the various problems in the related art and providing a high-stretchability/contractibility stretchable contractible wiring sheet that can be produced easily at low costs, has a high flexibility and a high durability, and undergoes a small resistance value change along with stretching and contracting, and a stretchable contractible touch sensor sheet.

Solution to Problem

Means for solving the above problems are as follows.
<1> A stretchable contractible wiring sheet, including:
a first elastomer sheet that is stretchable and contractible;
a second elastomer sheet that is stretchable and contractible, and bonded on the first elastomer sheet in a manner to face the first elastomer sheet, and
a lead that has a transverse section having any cross-sectional shape selected from the group consisting of a circular shape, an elliptical shape, and a track shape, and is plastically deformed in a wavy shape periodically curving along a longer direction of the lead,
the lead being interposed between the first elastomer sheet and the second elastomer sheet in a manner that a height direction of waves in the wavy shape is along an in-plane direction of facing surfaces of the first elastomer sheet and the second elastomer sheet.
<2> The stretchable contractible wiring sheet according to <1>,
wherein the lead contains a metallic structure formed of crystal grains that have an elongate shape in a longitudinal section of the lead.
<3> The stretchable contractible wiring sheet according to <1> or <2>,
wherein a diameter of the lead is at most 50 micrometers.
<4> The stretchable contractible wiring sheet according to any one of <1> to <3>,
wherein a Young's modulus of the lead is at least 150 GPa.
<5> The stretchable contractible wiring sheet according to any one of <1> to <4>,
wherein a wave height of the wavy shape is from 20 micrometers through 5 mm.
<6> The stretchable contractible wiring sheet according to any one of <1> to <5>,
wherein a ratio A/B is from 0.05 through 0.5, where A represents a curvature radius of wave crests of the waves in the wavy shape and B represents a periodic pitch interval between adjoining waves of the waves in the wavy shape.

<7> The stretchable contractible wiring sheet according to any one of <1> to <6>,
wherein a ratio A/D is from 3 through 100, where A represents a curvature radius of wave crests of the waves in the wavy shape and D represents a diameter of the lead.
<8> A stretchable contractible touch sensor sheet, including:
two stretchable contractible wiring sheets that each include:
a first elastomer sheet that is stretchable and contractible;
a second elastomer sheet that is stretchable and contractible, and bonded on the first elastomer sheet in a manner to face the first elastomer sheet, and
a plurality of leads that are formed side by side, each have a transverse section having any cross-sectional shape selected from the group consisting of a circular shape, an elliptical shape, and a track shape, and are each plastically deformed in a wavy shape periodically curving along a longer direction of the lead,
each of the leads being disposed between the first elastomer sheet and the second elastomer sheet in a manner that a height direction of waves in the wavy shape is along an in-plane direction of facing surfaces of the first elastomer sheet and the second elastomer sheet,
the first elastomer sheet and the second elastomer sheet being formed of a transparent material,
the two stretchable contractible wiring sheets being disposed in a manner to face each other in a state that a routing direction of the leads of one of the stretchable contractible wiring sheets and a routing direction of the leads of the other of the stretchable contractible wiring sheets are orthogonal.
<9> The stretchable contractible touch sensor sheet according to <8>,
wherein a haze value of the stretchable contractible touch sensor sheet is at most 60% or lower.

Advantageous Effects of Invention

The present invention can solve the various problems in the related art and provide a high-stretchability/contractibility stretchable contractible wiring sheet that can be produced easily at low costs, has a high flexibility and a high durability, and undergoes a small resistance value change along with stretching and contracting, and a stretchable contractible touch sensor sheet.

Figure 1A:
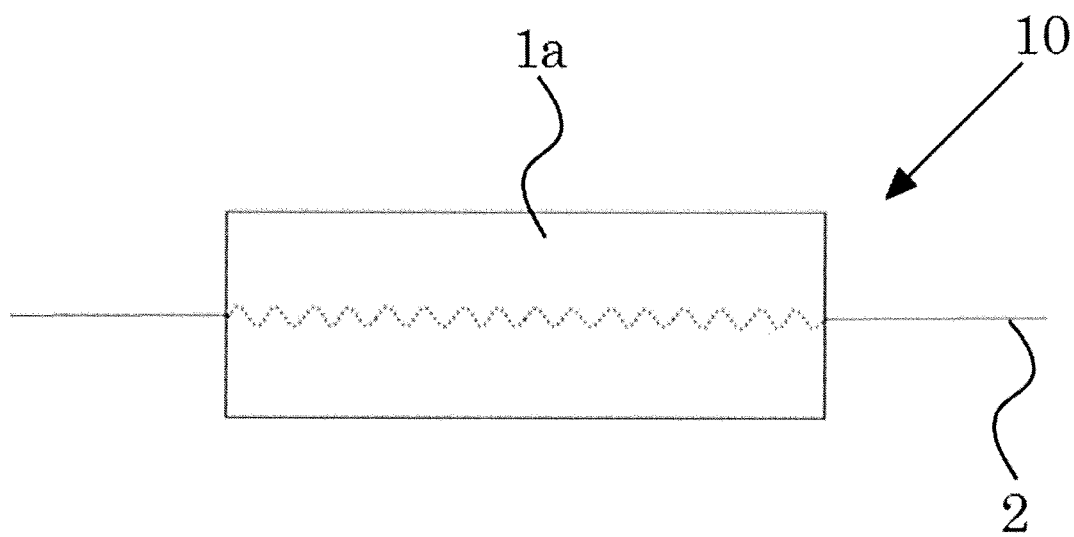
FIG. 1A is a view illustrating a sheet upper surface of a stretchable contractible wiring sheet.
Figure 1B:
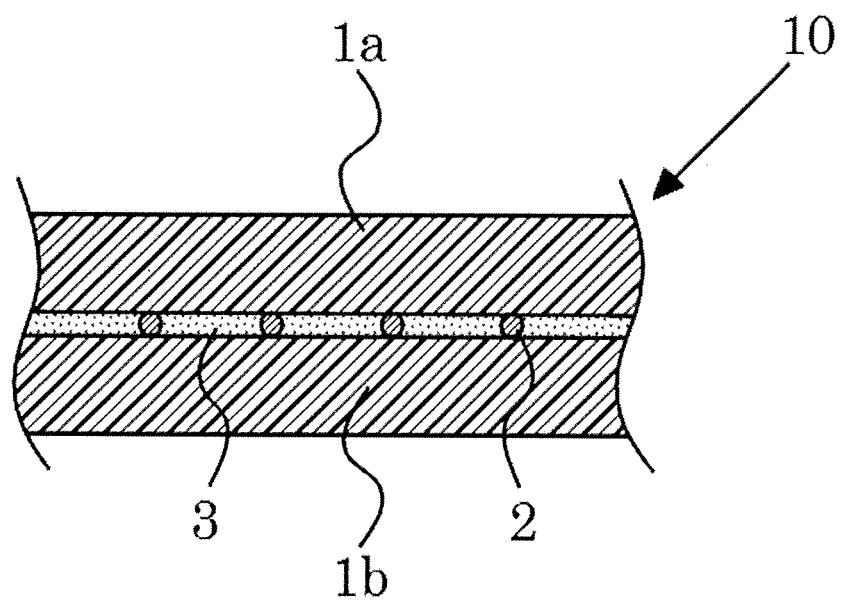
FIG. 1B is a cross-sectional view illustrating a sheet cross-section of a stretchable contractible sheet.

DESCRIPTION OF EMBODIMENTS (Stretchable Contractible Wiring Sheet)
A stretchable contractible wiring sheet 10 according to an embodiment of the present invention will be described with reference to FIG. 1A and FIG. 1B. FIG. 1A is a view illustrating a sheet upper surface of the stretchable contractible wiring sheet. FIG. 1B is a cross-sectional view illustrating a sheet cross-section of the stretchable contractible sheet.

As illustrated in FIG. 1A and FIG. 1B, the stretchable contractible wiring sheet 10 includes a first elastomer sheet 1a that is stretchable and contractible, a second elastomer sheet 1b that is stretchable and contractible, and bonded on the first elastomer sheet 1a in a manner to face the first elastomer sheet 1a, and a lead 2 interposed between the first elastomer sheet 1a and the second elastomer sheet 1b.

The first elastomer sheet 1a and the second elastomer sheet 1b are not particularly limited and may be appropriately selected depending on the intended purpose, so long as the first elastomer sheet 1a and the second elastomer sheet 1b elastically deform and undergo stretching and contracting. Sheets formed of known elastomer materials can be used. Examples include natural rubbers, diene-based rubbers, non-diene-based rubbers, urethane-based elastomers, styrene-based elastomers, and silicon-based elastomers.

When the stretchable contractible wiring sheet 10 is used as a stretchable contractible touch sensor sheet, display on the supporting side of the stretchable contractible wiring sheet 10 needs to be visible from the upper surface side of the stretchable contractible wiring sheet 10. Hence, the first elastomer sheet 1a and the second elastomer sheet 1b need to have transparency. In this case, as the first elastomer sheet 1a and the second elastomer sheet 1b, sheets formed of known elastomer materials having transparency can be used, and, for example, known urethane-based elastomer sheets, known acrylic-based elastomer sheets, and known silicon-based elastomer sheets can be used.

In this specification, the term "transparency" means that the visible light transmittance is 50% or higher.

The limit elongation rate of the first elastomer sheet 1a and the second elastomer sheet 1b is not particularly limited. However, because the stretchable contractible wiring sheet 10 can have a higher stretchability/contractibility as the limit elongation rate is higher, the limit elongation rate is preferably 50% (1.5 times longer than the equilibrium length) or higher, more preferably 300% (4 times longer than the equilibrium length) or higher, and particularly preferably 500% (6 times longer than the equilibrium length) or higher.

In this specification, the term "limit elongation rate" refers to an elongation rate at which the sheet is torn when the sheet is elongated.

The lower limit of the thickness of the first elastomer sheet 1a and the second elastomer sheet 1b is not particularly limited but is preferably 5 micrometers although depending on the material that forms the sheets. When the thickness is less than 5 micrometers, the shape of the wire having a wavy shape may clearly and perceptibly surface on the film surfaces. The upper limit of the thickness of the first elastomer sheet 1a and the second elastomer sheet 1b is not particularly limited but is preferably about 150 micrometers in terms of imparting a necessary flexibility and a necessary transparency to the stretchable contractible wiring sheet 10.

As the method for bonding the first elastomer sheet 1a and the second elastomer sheet 1b, there is a method of forming a viscous layer 3 on at least any one of facing surfaces of these sheets to paste these sheets with each other.

The physical properties of the viscous layer 3 such as flexibility and stretchability/contractibility after cured are appropriately selected so as not to inhibit the physical properties of the first elastomer sheet 1a and the second elastomer sheet 1b such as flexibility and stretchability/contractibility. Examples of the material forming the viscous layer include known rubber-based tackifiers, known urethane-based tackifiers, known acrylic-based tackifiers, and known silicon-based tackifiers. When the viscous layer is required to have transparency, it is preferable to use known urethane-based tackifiers, known acrylic-based tackifiers, and known silicon-based tackifiers.

The viscous force of the viscous layer 3 is not particularly limited but is preferably at least from 0.5 N/cm through 10 N/cm. When the viscous force is less than 0.5 N/cm, the elastomer sheets and the lead 2 may be detached during stretching and contracting, and transparency may be lost. When the viscous force is greater than 10 N/cm, there is a risk that a load applied to the wiring during stretching and contracting may be high, to break the wiring.

The lead 2 has a transverse section having any cross-sectional shape selected from the group consisting of a circular shape, an elliptical shape, and a track shape. Among these shapes, a circular shape is optimum. Compared with a lead having a rectangular cross-section that tends to receive stress concentration on the squared edges and have lead braking when an external force is applied in a direction in which the lead is bent, the lead 2 having a curved surface on the edge tends not to receive stress concentration when an external force is applied in a direction in which the lead 2 is bent, and can reduce the risk of lead breaking. Therefore, use of such a lead 2 can impart an excellent durability to the stretchable contractible wiring sheet 10.

In this specification, the transverse section refers to a surface exposed when the lead is cut perpendicularly to the longer direction of the lead, and a longitudinal section refers to a surface exposed when the lead is cut in parallel with the longer direction of the lead.

The lead 2 is plastically deformed in a wavy shape periodically curving along the longer direction of the lead, and interposed between the first elastomer sheet 1a and the second elastomer sheet 1b in a manner that the height direction of the waves in the wavy shape is along the in-plane direction of the facing surfaces of these sheets.

With the lead 2 disposed in this state between the first elastomer sheet 1a and the second elastomer sheet 1b, a high-stretchability/contractibility stretchable contractible wiring sheet 10 having a high flexibility is formed. That is, without using a circuit board having a poor flexibility but using the linear lead 2, an excellent flexibility and an excellent stretchability/contractibility are imparted to the stretchable contractible wiring sheet 10, based on easy conformity of the lead 2 to shape changes of the first elastomer sheet 1a and the second elastomer sheet 1b and deformation of the lead 2 from the wavy shape to close to a straight-line shape so as to conform to elongation of both of the sheets. Furthermore, in this lead 2, the length of a path through which electricity flows during elongation remains unchanged from the equilibrium length during unloading, and the resistance value is stable.

In this specification, the term "unloading" refers to a state that shape changes such as elongation and bending are not applied to the stretchable contractible wiring sheet 10.

The diameter of the lead 2 is not particularly limited but is preferably at most 50 micrometers, more preferably 25 micrometers, and particularly preferably 12 micrometers in terms of imparting transparency to the stretchable contractible wiring sheet 10. The diameter of the lead 2 when the cross-sectional shape of the lead 2 is other than a circular shape refers to the diameter at a position at which that cross-sectional shape has the longest dimension. The lower limit of the diameter of the lead 2 is about 1 micrometer.

The lead 2 is not particularly limited, but preferably contains a metallic structure formed of crystal grains that have an elongate shape in a longitudinal section of the lead. With such a metallic structure, the strength and fatigue resistance of the lead 2 are improved, leading to greater improvement of the durability of the stretchable contractible wiring sheet 10.

The method for forming such a lead 2 is not particularly limited, and examples of the method include forming methods based on known plastic working such as wire drawing and rolling. Depending on the condition of the plastic working, the lead 2 can be formed to have a tensile strength of about 400 MPa even when the material forming the lead 2 is copper.

In terms of imparting transparency to the stretchable contractible wiring sheet 10, the diameter of the lead 2 is set extremely thin as described above. Hence, there is a need for selecting materials and setting the wavy shape in a manner that the lead 2 does not break when shape changes such as elongation and bending are applied to the stretchable contractible wiring sheet 10.

The Young's modulus (modulus of longitudinal elasticity) of the lead 2 is preferably at least 150 GPa in terms of improving flexibility and durability of the lead 2. The upper limit of the Young's modulus (modulus of longitudinal elasticity) is about 500 GPa. For measuring the Young's modulus (modulus of longitudinal elasticity), a tensile test of the lead 2 is performed to obtain a stress-strain curve. The Young's modulus can be calculated by obtaining the slope of a straight line portion of the stress-strain curve.

When the curvature radius of the wave crests of the waves in the wavy shape is assumed to be A and the periodic pitch interval between adjoining waves of the waves in the wavy shape is assumed to be B, the ratio A/B is not particularly limited but is preferably from 0.05 through 0.5. That is, when the ratio A/B is less than 0.05, the curving portions have a large strain that may break the lead. When the ratio A/B is greater than 0.5, it may be difficult to form a periodic wavy shape.

Even when the lead 2 is formed of a material having a low elastic modulus such as a copper line, configuring the lead 2 to have a ratio A/D of from 3 through 100 and more preferably from 5 through 30 makes the lead 2 less likely to receive stress concentration when an external force is applied in a direction in which the lead is bent, and can reduce the risk of lead breaking, where A represents the curvature radius of the wave crests of the waves in the wavy shape and D represents the diameter of the lead. That is, when the ratio A/D is less than 3, a bending stress is high, which increases the risk of lead breaking. When the ratio A/D is greater than 100, the curvature radius A is large, which may reduce the elongatable range of the stretchable contractible wiring sheet 10.

The wave height of the wavy shape is not particularly limited but is preferably from 20 micrometers through 5 mm. That is, when the wave height is less than 20 micrometers, the lead 2 has an approximately rod-like shape, which may reduce the elongatable range of the stretchable contractible wiring sheet 10. When the wave height is greater than 5 mm, the lead 2 in the stretchable contractible wiring sheet 10 becomes more visible, which may make it impossible to obtain a necessary transparency.

The waveform of the wavy shape can be recognized from outside of the stretchable contractible wiring sheet 10 with a known optical microscope, a known digital microscope, a known electron microscope, and a known X-ray microscope.

The resistivity of the lead 2 is not particularly limited, may be appropriately selected depending on the intended purpose, and is about from $1.0 \times 10^{-6}$ Ω·cm through $1.0 \times 10^{-3}$ Ω·cm.

The material forming the lead 2 is not particularly limited and may be appropriately selected considering each of the properties described above. Examples of the material include known metal wires such as copper, copper alloys, stainless steel represented by SUS304, tungsten, tungsten alloys, and carbon steel, and carbon fiber. Among the metal wires, those that have a relatively high resistivity such as piano wires and SUS304 wires mentioned above may be used with plating on the surface with a metal having a low resistivity, such as copper and silver.

The stretchable contractible wiring sheet 10 includes one lead 2. However, a plurality of leads 2 may be formed side by side.

The stretchable contractible wiring sheet 10 configured as described above has a high flexibility and a high durability, undergoes a small resistance value change along with shape change, and can be produced easily at low costs. Therefore, use of the stretchable contractible wiring sheet 10 as a wiring sheet can be expected in a wide range of fields such as wirings for RFID devices required to have flexibility, wirings for motion analysis sensors in the sport science, wirings for heart rate/electrocardiogram monitors, wirings for movable parts of robots, and wirings for touch sensor panels configured to send instructions to computers.

Next, an example of a method for producing the stretchable contractible wiring sheet 10 will be described.

The lead 2 may be a commercially available product. However, use of a plastically worked product as described above can improve the strength and fatigue resistance of the lead 2 and consequently improve the durability of the stretchable contractible sheet 10.

Figure 2:
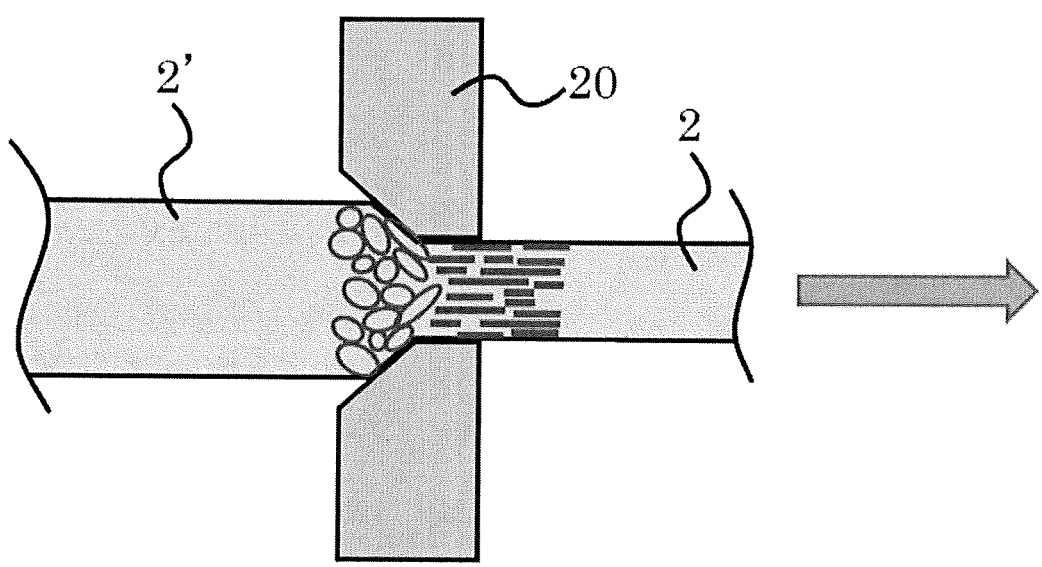
FIG. 2 is a view illustrating how wire drawing is performed.

That is, as illustrated in FIG. 2, a lead forming material 2' that has been thermally treated is drawn in the direction of the arrow using a wire drawing die 20. This enables crystal grains having random shapes before working to have an elongate shape along the longer direction (the direction of the arrow in the drawing) after working, and enables the lead 2 to be formed to contain a metallic structure formed of the crystal grains oriented in this direction. The step of wire-drawing the lead forming material 2' may be performed a plurality of times in a manner to sequentially pass the lead forming material 2' through dies having gradually decreasing diameters. Note that FIG. 2 is a view illustrating how wire drawing is performed.

When lead forming materials based on carbon steel wires such as piano wires and containing metallic structures called pearlite structures obtained by patenting (thermal treatment) are subjected to wire drawing, stratified ferrite and cementite that have been oriented in arbitrary directions are oriented in the longer direction to form fibrous metallic structures. Likewise, through wire drawing, lead forming materials obtained by solutionizing metals such as stainless steel and copper are changed to metallic structures in which minute acicular or rod-like crystal grains are oriented in the longer direction.

In the wire drawing, improvement of the tensile strength and fatigue resistance is greater, as the working ratio (reduction of area) represented by the following formula (1) is higher. Hence, the working ratio of the lead 2 is preferably 50% or higher, more preferably 90% or higher, and particularly preferably 95% or higher. The upper limit of the working ratio is about 99%. When the working ratio is higher than the limit (about 99%), the tensile strength and fatigue resistance considerably deteriorate to the contrary.

$$\text{Working ratio (\%)} = \left(1 - \frac{dn^2}{d0^2}\right) \times 100 \quad (1)$$

In the formula (1) above, d0 represents the diameter of the lead forming material at the initial stage before being passed through a die, and dn represents the final diameter of the lead formed by passing the lead forming material through dies n times (n being an integer of 1 or greater).

Wire drawing has been taken for example in the above description. However, any other plastic working such as rolling can also form a lead containing a metallic structure formed of crystal grains having an elongate shape along the longer direction, with appropriate adjustment of the direction in which a pressure is applied.

The elongate shape encompasses all shapes that have a longer dimension in one direction. Representative examples include the fibrous shape, the acicular shape, and the rod-like shape mentioned above.

Figure 3:
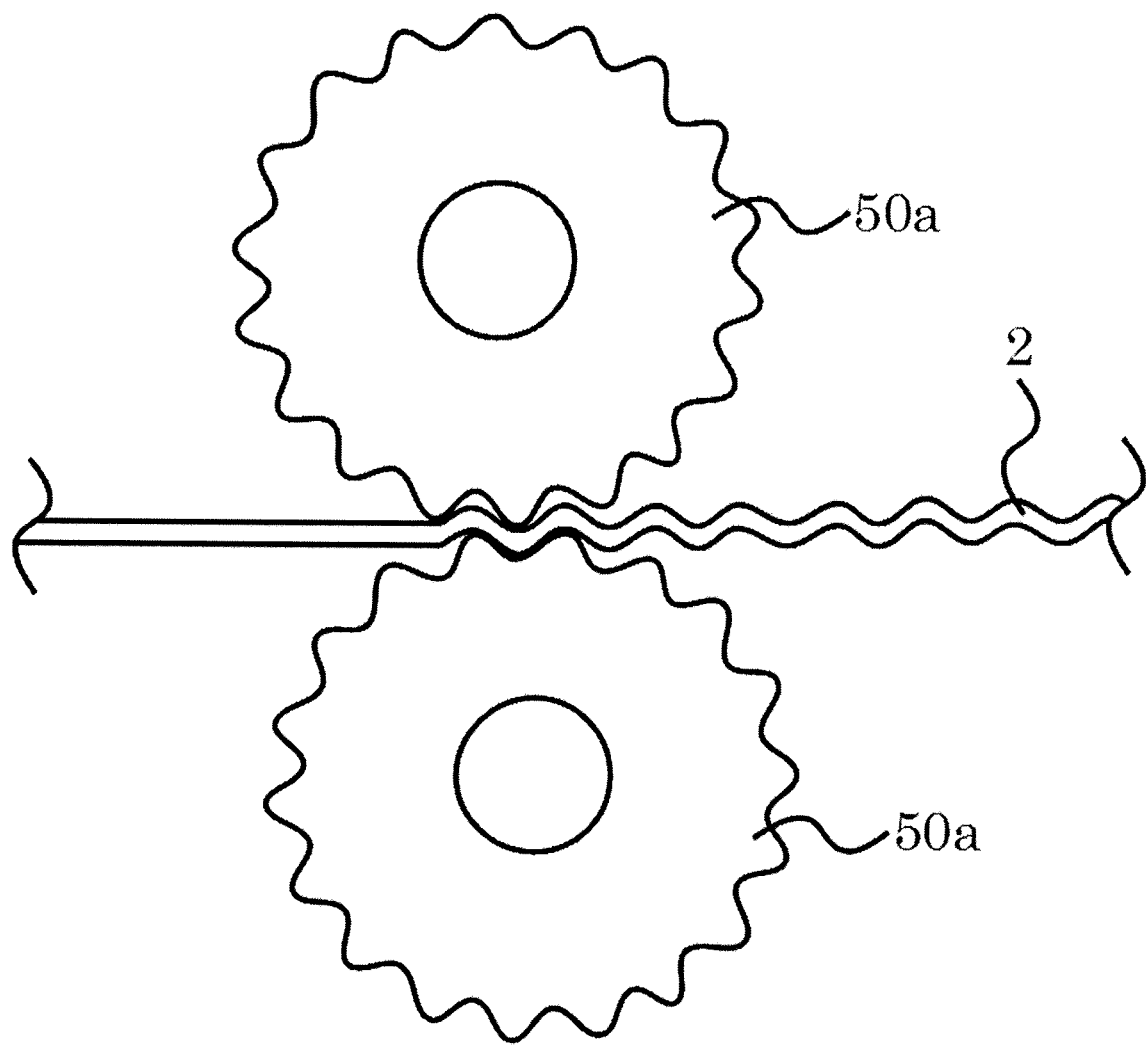
FIG. 3 is a view illustrating how a straight-line-shaped lead is worked into a wavy shape.

The method for working the straight-line-shaped lead 2 into the wavy shape is not particularly limited. Examples of the method include a method of passing the straight-line-shaped lead 2 between two gears 50a and b that are formed to have a wave pattern for the intended wavy shape, as illustrated in FIG. 3. FIG. 3 is a view illustrating how a straight-line-shaped lead is worked into a wavy shape.

The stretchable contractible wiring sheet 10 can be produced easily at low costs, by pasting the first elastomer sheet 1a and the second elastomer sheet 1b with each other in a state that the lead 2 plastically deformed in this manner to have the wavy shape is interposed between the sheets.

The above-described method for producing the stretchable contractible wiring sheet 10 has been described to work a straight-line-shaped lead into the wavy shape. Instead of this method, a coil-shaped lead may be worked into the wavy shape.

That is, the lead 2 having the wavy shape can be obtained by extending the coil-shaped lead to an extent until which the coil wire does not fold, introducing the lead into, for example, a rolling roller, and rolling the lead from above and below.

(Stretchable Contractible Touch Sensor Sheet)

Figure 4A:
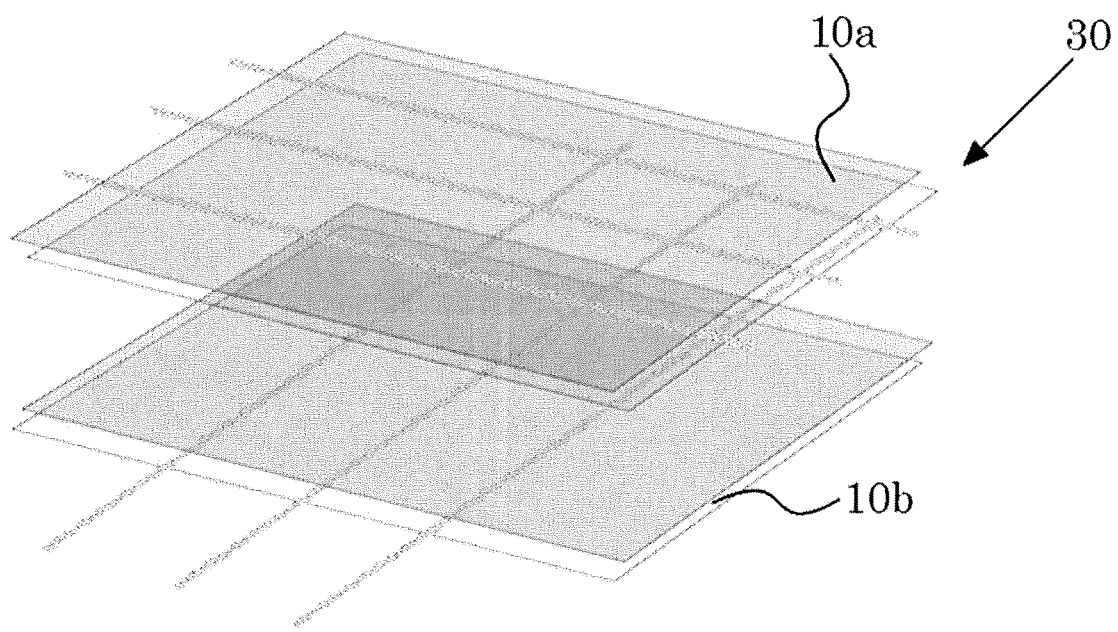
FIG. 4A is a view illustrating a configuration example of a stretchable contractible touch sensor sheet.

Next, a stretchable contractible touch sensor sheet of the present invention will be described with reference to FIG. 4A. FIG. 4A is a view illustrating a configuration example of the stretchable contractible touch sensor sheet.

This stretchable contractible touch sensor sheet 30 is formed of two stretchable contractible wiring sheets of the present invention.

That is, the stretchable contractible touch sensor sheet 30 is formed of two stretchable contractible wiring sheets 10a and 10b that each include: a first elastomer sheet that is stretchable and contractible; a second elastomer sheet that is stretchable and contractible, and bonded on the first elastomer sheet in a manner to face the first elastomer sheet, and a plurality of leads that are formed side by side, each have a transverse section having any cross-sectional shape selected from the group consisting of a circular shape, an elliptical shape, and a track shape, and are each plastically deformed in a wavy shape periodically curving along a longer direction of the lead, wherein each of the leads is disposed between the first elastomer sheet and the second elastomer sheet in a manner that a height direction of waves in the wavy shape is along an in-plane direction of facing surfaces of the first elastomer sheet and the second elastomer sheet, wherein the first elastomer sheet and the second elastomer sheet are formed of a transparent material, and wherein the two stretchable contractible wiring sheets 10a and 10b are disposed in a manner to face each other in a state that a routing direction of the leads of one of the stretchable contractible wiring sheets and a routing direction of the leads of the other of the stretchable contractible wiring sheets are orthogonal.

The stretchable contractible touch sensor sheet 30 having this configuration can endure shape changes in any of an elongating direction and a bending direction. Therefore, even when installed on a place having a curved surface, the stretchable contractible touch sensor sheet 30 can flexibly deform and conform to the curved surface, and can exhibit an excellent durability even when disposed on the curved surface.

The stretchable contractible touch sensor sheet 30 can be used as a conductive sheet for known touch sensors such as a resistance change-type touch sensor and a capacitance-type touch sensor.

Figure 4B:
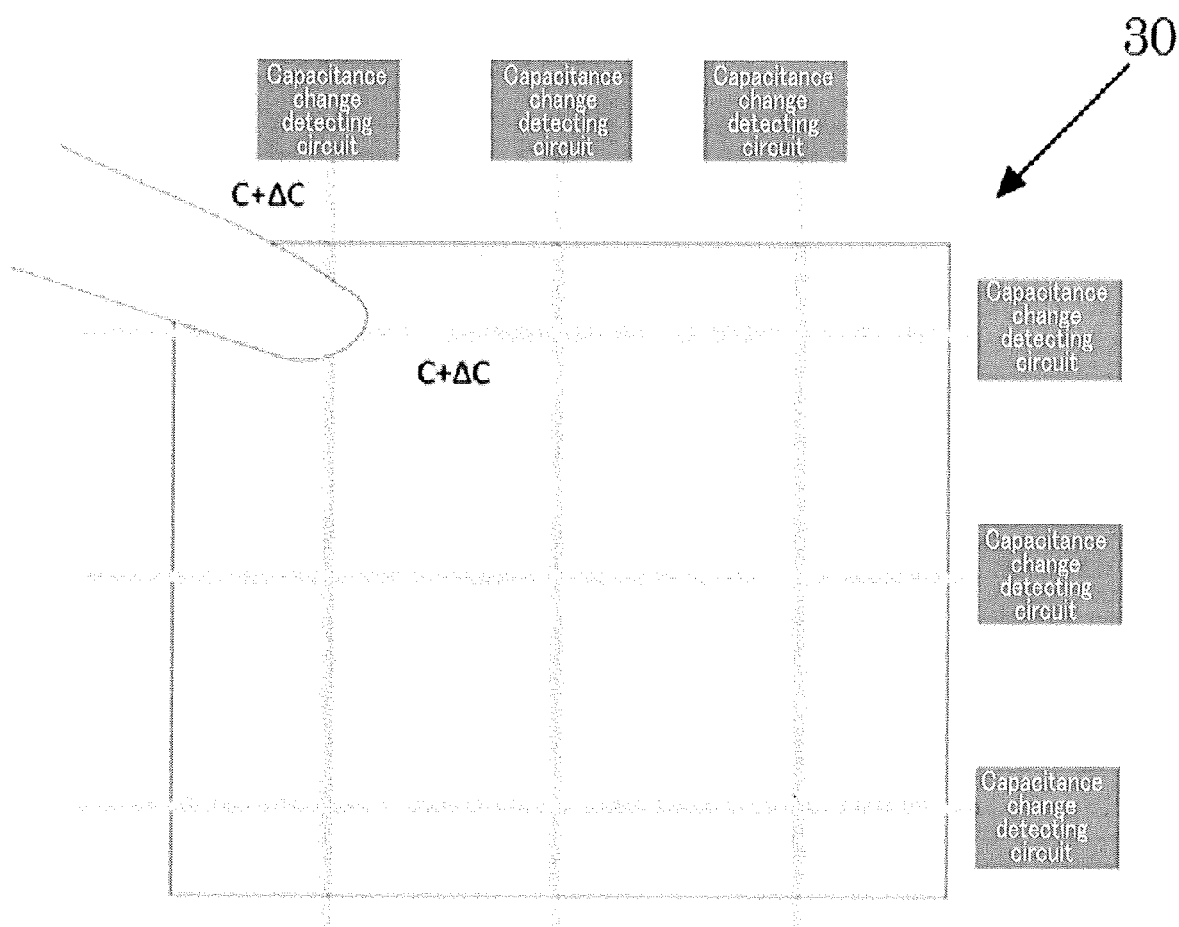
FIG. 4B is a view illustrating a configuration example of a capacitance-type touch sensor.

For example, a configuration example of a capacitance-type touch sensor is illustrated in FIG. 4B.

In this capacitance-type touch sensor, capacitance change detecting circuits are coupled to one-side ends of the leads that are disposed in a lengthwise-and-crosswise matrix formation and electrified, to detect capacitance changes of the stretchable contractible touch sensor sheet 30 along with touch operations.

In the illustrated example, one lead is constituted as one detection line. However, when an optimum resistance value for detection is difficult to obtain, a plurality of leads may be coupled to one capacitance change detecting circuit and configured as one detection line.

When the stretchable contractible touch sensor sheet 30 is used for the resistance change-type touch sensor, it is preferable to select the material of the leads in a manner that a resistance value change during stretching and contracting is 5% or lower. It is also preferable to design the resistance value of one detection line per unit length to 100 Ω/cm or less.

On the other hand, when the stretchable contractible touch sensor sheet 30 is used for the capacitance-type touch sensor, it is preferable to select the material of the leads in a manner that a resistance value change during stretching and contracting is 30% or lower. It is also preferable to design the resistance value of one detection line per unit length to 500 Ω/cm or less.

In the stretchable contractible touch sensor sheet 30, the first elastomer sheets and the second elastomer sheets constituting the stretchable contractible touch sensor sheet 30 are required to have a transparency corresponding to a visible light transmittance of 50% or higher in the state of being faced with each other, in consideration of visibility of stains on the touching surface and visibility of images on the display when seen through this touch sensor.

The haze value of the stretchable contractible touch sensor sheet 30 is preferably as low as possible (for example, 3%) in terms of transparency, and is preferably at most 60%. The haze value is measured by irradiating the sheet with visible light and measuring the ratio of diffuse transmitted light to total transmitted light.

The haze value can be adjusted based on, for example, the diameter of the leads and the intervals at which the leads are formed side by side.

Here, a relationship among the diameter of the leads, the distance to the touch sensor, and visibility of the leads is presented in Table 1 below.

TABLE 1

| | Diameter | | | | |
|---|---|---|---|---|---|
| Distance | 9 micrometers | 12 micrometers | 25 micrometers | 30 micrometers | 40 micrometers |
| 30 cm | B | C | C | D | D |
| 50 cm | B | B | C | C | D |
| 100 cm | B | B | B | B | C |

Table 1 presents subjective evaluation, where B indicates invisibility, C indicates slight visibility, and D indicates visibility.

Hence, when the stretchable contractible touch sensor sheet 30 is applied to a touch sensor for a high-definition panel or a high-definition printed matter, the diameter of the leads is preferably 12 micrometers or less.

On the other hand, when the stretchable contractible touch sensor sheet is used for an application in which a large-sized screen such as a vending machine and a digital signage is used, image high definition is not required, and the display is observed from a distance of 1 m or greater, the diameter of the leads may be about 40 micrometers or less.

When the intervals at which the leads are formed side by side are about from 100 micrometers through 10 mm, the haze value described above tends to be obtained.

As a further application, when the stretchable contractible touch sensor sheet is applied to a touch sensor for a foldable display of an information terminal such as a smart phone, the number of times the stretchable contractible touch sensor sheet can endure bending is preferably 100,000 times or greater, on the condition that the curvature radius of the wavy shape of the leads is 1 mm.

When the stretchable contractible touch sensor sheet is applied to a touch sensor for a wearable device for a sliding portion such as a human joint, a high stretchability/contractibility and a high durability are required. Hence, the elongation rate is preferably 50% or higher and the number of times of enduring bending is preferably 100,000 times or greater.

When the touch sensor is mounted on a curved surface in, for example, the interior of an automobile by pasting, the elongation rate is preferably 60% or higher and a resistance change rate of the leads is preferably 5% or lower.

REFERENCE SIGNS LIST

1a: first elastomer sheet
1b: second elastomer sheet
2: lead
2': lead forming material
3: viscous layer 10, 10a, 10b: stretchable contractible wiring sheet
20: die
30: stretchable contractible touch sensor sheet
50a, b: gear

The invention claimed is:

1. A stretchable contractible wiring sheet, comprising:
   a first elastomer sheet that is stretchable and contractible;
   a second elastomer sheet that is stretchable and contractible, and bonded on the first elastomer sheet in a manner to face the first elastomer sheet, and
   a fibrous lead that has a transverse section having any cross-sectional shape selected from the group consisting of a circular shape, an elliptical shape, and a track shape, and is plastically deformed in a wavy shape periodically curving along a longer direction of the lead,
   the lead being interposed between the first elastomer sheet and the second elastomer sheet in a manner that a height direction of waves in the wavy shape is along an in-plane direction of facing surfaces of the first elastomer sheet and the second elastomer sheet when seen in a plan view,
   wherein the lead comprises a metallic structure formed of crystal grains that have an elongate shape in a longitudinal section of the lead and are oriented in the longer direction of the lead.

2. The stretchable contractible wiring sheet according to claim 1,
   wherein a diameter of the lead is at most 50 micrometers.

3. The stretchable contractible wiring sheet according to claim 1,
   wherein a Young's modulus of the lead is at least 150 GPa.

4. The stretchable contractible wiring sheet according to claim 1,
   wherein a wave height of the wavy shape is from 20 micrometers through 5 mm.

5. The stretchable contractible wiring sheet according to claim 1,
   wherein a ratio AB is from 0.05 through 0.5, where A represents a curvature radius of wave crests of the waves in the wavy shape and B represents a periodic pitch interval between adjoining waves of the waves in the wavy shape.

6. The stretchable contractible wiring sheet according to claim 1,
   wherein a ratio A/D is from 3 through 100, where A represents a curvature radius of wave crests of the waves in the wavy shape and D represents a diameter of the lead.

7. A stretchable contractible touch sensor sheet, comprising:
   two stretchable contractible wiring sheets that each comprise:
   a first elastomer sheet that is stretchable and contractible;
   a second elastomer sheet that is stretchable and contractible, and bonded on the first elastomer sheet in a manner to face the first elastomer sheet, and
   a plurality of fibrous leads that are formed side by side, each have a transverse section having any cross-sectional shape selected from the group consisting of a circular shape, an elliptical shape, and a track shape, and are each plastically deformed in a wavy shape periodically curving along a longer direction of the lead,
   each of the leads being disposed between the first elastomer sheet and the second elastomer sheet in a manner that a height direction of waves in the wavy shape is along an in-plane direction of facing surfaces of the first elastomer sheet and the second elastomer sheet when seen in a plan view,
   the first elastomer sheet and the second elastomer sheet being formed of a transparent material,
   the two stretchable contractible wiring sheets being disposed in a manner to face each other in a state that a routing direction of the leads of one of the stretchable contractible wiring sheets and a routing direction of the leads of the other of the stretchable contractible wiring sheets are orthogonal
   wherein the leads each comprise a metallic structure formed of crystal grains that have an elongate shape in a longitudinal section of the lead and are oriented in the longer direction of the lead.

8. The stretchable contractible touch sensor sheet according to according to claim 7,
   wherein a haze value of the stretchable contractible touch sensor sheet is at most 60% or lower.

9. The stretchable contractible wiring sheet according to claim 1,
   wherein a plurality of the leads are formed side by side.

* * * * *